US009148133B2

(12) United States Patent
Irisawa

(10) Patent No.: US 9,148,133 B2
(45) Date of Patent: Sep. 29, 2015

(54) TRIMMING CIRCUIT, POWER SUPPLY INCLUDING TRIMMING CIRCUIT, AND TRIMMING METHOD

(71) Applicant: Tatsuya Irisawa, Hyogo (JP)

(72) Inventor: Tatsuya Irisawa, Hyogo (JP)

(73) Assignee: RICOH ELECTRONIC DEVICES CO., LTD., Osaka (JP)

( * ) Notice: Subject to any disclaimer, the term of this patent is extended or adjusted under 35 U.S.C. 154(b) by 241 days.

(21) Appl. No.: 13/948,587

(22) Filed: Jul. 23, 2013

(65) Prior Publication Data
US 2014/0028248 A1    Jan. 30, 2014

(30) Foreign Application Priority Data
Jul. 27, 2012  (JP) ................................ 2012-166914

(51) Int. Cl.
| | |
|---|---|
| G05F 1/10 | (2006.01) |
| H03K 5/00 | (2006.01) |
| H02J 7/00 | (2006.01) |
| H02M 3/157 | (2006.01) |
| H02M 1/00 | (2007.01) |

(52) U.S. Cl.
CPC . *H03K 5/00* (2013.01); *H02J 7/007* (2013.01); *H02M 3/157* (2013.01); *H02M 2001/0009* (2013.01); *H02M 2001/0025* (2013.01)

(58) Field of Classification Search
None
See application file for complete search history.

(56) References Cited

U.S. PATENT DOCUMENTS

| | | | |
|---|---|---|---|
| 5,982,163 A | 11/1999 | Shinozaki | |
| 6,396,759 B1 | 5/2002 | Lesher | |
| 6,472,897 B1 | 10/2002 | Shyr et al. | |
| 7,436,222 B2 | 10/2008 | Shyr et al. | |
| 7,579,903 B2 * | 8/2009 | Oku | 327/538 |
| 7,782,083 B2 * | 8/2010 | Lalithambika et al. | 326/38 |
| 2003/0085741 A1 | 5/2003 | Shyr et al. | |
| 2004/0216019 A1 | 10/2004 | Shyr et al. | |
| 2005/0077923 A1 | 4/2005 | Kim et al. | |
| 2006/0017494 A1 * | 1/2006 | Horiguchi et al. | 327/538 |
| 2006/0056238 A1 * | 3/2006 | Park et al. | 365/185.22 |

(Continued)

FOREIGN PATENT DOCUMENTS

| | | |
|---|---|---|
| CN | 1349251 | 5/2002 |
| JP | 11-346127 | 12/1999 |

(Continued)

OTHER PUBLICATIONS

Battery Charging Specification, Revision 1.2, Dec. 7, 2010.

*Primary Examiner* — Cassandra Cox
(74) *Attorney, Agent, or Firm* — Cooper & Dunham LLP

(57) ABSTRACT

A trimming circuit, installed in a semiconductor integrated circuit that has multiple different target values, the trimming circuit to adjusts circuit characteristics of the semiconductor integrated circuit to make output values of the semiconductor integrated circuit correspond to multiple desired target values and includes a setting-value table memory to store multiple setting value groups respectively containing different combinations of multiple setting values related to the multiple target values; a trimming cell circuit to store first selection information indicating one group of the multiple setting-value groups stored in the setting-value table memory; and a selector to select one group from the multiple setting-value group stored in the setting-value table memory based on the first selection information, and select one setting value from multiple setting values in the selected setting-value group based on external second selection information to output the selected setting value.

8 Claims, 9 Drawing Sheets

(56) References Cited

U.S. PATENT DOCUMENTS

| | | |
|---|---|---|
| 2006/0172606 A1 | 8/2006 | Irisawa |
| 2007/0208889 A1 | 9/2007 | Irisawa |
| 2007/0285105 A1* | 12/2007 | Bergstedt et al. ............. 324/538 |
| 2008/0061872 A1 | 3/2008 | Hughes |
| 2008/0061873 A1 | 3/2008 | Hughes |
| 2008/0111576 A1 | 5/2008 | Shyr et al. |
| 2008/0252378 A1 | 10/2008 | Hughes |
| 2009/0033373 A1 | 2/2009 | Shyr et al. |
| 2010/0090750 A1 | 4/2010 | Kim |
| 2011/0026355 A1 | 2/2011 | Irisawa |
| 2011/0187444 A1* | 8/2011 | Jin et al. ........................ 327/538 |

FOREIGN PATENT DOCUMENTS

| | | |
|---|---|---|
| JP | 2002-231887 | 8/2002 |
| JP | 2004-362300 | 12/2004 |
| JP | 2008-140960 | 6/2008 |
| JP | 4928921 | 5/2012 |
| JP | 4945226 | 6/2012 |
| KR | 10-2006-085642 | 7/2006 |
| KR | 10-2009-058549 | 6/2009 |
| KR | 10-2010-411389 | 4/2010 |

\* cited by examiner

| POWER_TYPE | 1 | 2 | 3 | 4 | 5 |
|---|---|---|---|---|---|
| CASE 1 | 100 | 500 | 900 | 1500 | 2500 |
| CASE 2 | 105 | 526 | 947 | 1578 | 2631 |
| CASE 3 | 95 | 476 | 857 | 1428 | 2380 |
| CASE 4 | 95 | 476 | 857 | 1516 | 2627 |
| CASE 5 | 100 | 500 | 900 | 1531 | 2584 |
| CASE 6 | 100 | 500 | 900 | 1471 | 2423 |
| CASE 7 | 100 | 500 | 900 | 1500 | 2452 |
| CASE 8 | 100 | 500 | 900 | 1500 | 2552 |

FIG. 5

| POWER_TYPE | 1 | 2 | 3 | 4 | 5 |
|---|---|---|---|---|---|
| CASE 1 | 100 | 500 | 900 | 1500 | 2500 |
| CASE 2 | 95 | 475 | 855 | 1425 | 2375 |
| CASE 3 | 105 | 525 | 945 | 1575 | 2625 |
| CASE 4 | 105 | 525 | 945 | 1485 | 2385 |
| CASE 5 | 100 | 500 | 900 | 1470 | 2420 |
| CASE 6 | 100 | 500 | 900 | 1530 | 2580 |
| CASE 7 | 100 | 500 | 900 | 1500 | 2550 |
| CASE 8 | 100 | 500 | 900 | 1500 | 2450 |

| POWER_TYPE | 1 | 2 | 3 | 4 | 5 |
|---|---|---|---|---|---|
| TARGET CURRENT | 100 | 500 | 900 | 1500 | 2500 |
| WITHOUT TRIMMING | 104 | 520 | 936 | 1560 | 2600 |
| ERROR | 4 | 20 | 36 | 60 | 100 |
| WITH TRIMMING | 99 | 495 | 891 | 1486 | 2476 |
| ERROR | -1 | -5 | -9 | -14 | -24 |

| POWER_TYPE | 1 | 2 | 3 | 4 | 5 |
|---|---|---|---|---|---|
| CASE 1 (−0) | 100 | 500 | 900 | 1500 | 2500 |
| CASE 1 (−10) | 90 | 490 | 890 | 1490 | 2490 |
| CASE 1 (−20) | 80 | 480 | 880 | 1480 | 2480 |
| CASE 2 (−0) | 105 | 526 | 947 | 1578 | 2631 |
| CASE 2 (−10) | 95 | 516 | 937 | 1568 | 2621 |
| CASE 2 (−20) | 85 | 506 | 927 | 1558 | 2611 |
| ⋮ | | | | | |

| POWER_TYPE | 1 | 2 | 3 | 4 | 5 |
|---|---|---|---|---|---|
| CASE 1 (+0) | 100 | 500 | 900 | 1500 | 2500 |
| CASE 1 (+10) | 110 | 510 | 910 | 1510 | 2510 |
| CASE 1 (+20) | 120 | 520 | 920 | 1520 | 2520 |
| CASE 2 (+0) | 95 | 475 | 855 | 1425 | 2735 |
| CASE 2 (+10) | 105 | 485 | 865 | 1435 | 2745 |
| CASE 2 (+20) | 115 | 495 | 875 | 1445 | 2755 |
| ⋮ | | | | | |

TRIMMING CIRCUIT, POWER SUPPLY INCLUDING TRIMMING CIRCUIT, AND TRIMMING METHOD

CROSS-REFERENCE TO RELATED APPLICATION

This patent application is based on and claims priority pursuant to 35 U.S.C. §119 to Japanese Patent Application No. 2012-166914, filed on Jul. 27, 2012, in the Japan Patent Office, the entire disclosure of which is hereby incorporated by reference herein.

BACKGROUND

1. Field

The present disclosure relate to a trimming circuit to adjust fluctuation in circuit characteristics, a power supply including the trimming circuit, and a trimming method executed by the trimming circuit.

2. Description of the Background Art

In semiconductor integrated circuits, due to fluctuation in circuit characteristics, there is a difference between target values (e.g., upper limits of current and voltage), desired to be output from the semiconductor integrated circuit, and an actual output value (e.g., upper limits of detected current and voltage). Accordingly, the semiconductor integrated circuit includes a trimming circuit that adjusts the circuit characteristics (perform trimming) so that an output value is consistent with the target value. The trimming circuit, which is generally formed by a ladder resistor circuit, adjusts an output voltage of the ladder resistor circuit to perform trimming. In order to adjust the output voltage of the ladder resistor circuit, an adder to add a certain offset to the output voltage of the ladder resistor circuit and a multiplexer to correct rate of change (gradient) of the output voltage relative to the target value are used.

For example, in JP-2002-231887-A discloses a programmable trimming circuit to trim a reference voltage of an integrated circuit after the integrated circuit is mounted on a chip and is packed. In this example, the trimming circuit includes a first resistor, multiple programmable trimming cell circuits, a digital analog converter (ladder resistor circuit), and a second resistor. The first resistor is controlled to generate a sequence of a test bit signal and a sequence of a setting bit signal. The multiple trimming cell circuits, selectively connected to the first resistor, receive the test bit signal and the setting bit signal and generate output signals similarly to the received signals. The digital analog converter, constituted by the ladder resistor circuit, converts the output signals into trimming currents proportional to the output signals. The second resistor converts the trimming currents into trimming voltages and superimposes the trimming voltages on initial values of reference voltages generated by the integrated circuit.

In this example, when the reference voltage of the integrated circuit is trimmed, the initial value of the reference voltage generated by the integrated circuit is measured, the initial value of the reference voltage is compared with an accurately detected reference voltage, and a control signal indicating the difference therebetween is generated. Then, the multiple trimming cell circuits generate the bit sequence representing signs and magnitudes of the trimming currents, generate the trimming currents having the magnitude and sign proportional to the bit sequences, superimposing the trimming voltage converted from the trimming current, and determines whether or not the superimposed voltage is equal to the accurately detected reference voltage. When the superimposed voltage is suitable and equal to the accurately detected reference voltage, the trimming cell circuits permanently set the bit values when the bit sequence is generated.

In the above-described example, multiple trimming cell circuits respectively include fuses, and melt and cut the fuses to set the bit value "1" permanently. Accordingly, in this example, once trimming is performed, adjusting cannot be performed again.

Although the conventional trimming method is effective when linearity is present in the difference between the target value and the output value that is, when the output value (dependent variable y) changes at a constant rate (linearly) with the target values (independent variable x), otherwise, trimming cannot be performed. For example, when the semiconductor integrated circuit installing the trimming circuit is a power supply (e.g., switching regulator), since the characteristics fluctuate by generating current noise and heating as the output current of the power supply is increased, the upper limit of the output current (limit current) does not linearity change with the target values. Accordingly, when the power supply is operated in multiple modes having different upper limit currents respectively, performing trimming is difficult using the conventional method.

As detail example of semiconductor integrated circuit that is operated in the multiple modes having different upper limit currents respectively, a power supply of a universal serial bus (USB) that receives power from a USB host device via a USB interface.

At present, the USB is a standard to serial interface and is also used as an interface for supplying power.

The standard of "Battery charging specification revision 1.2" is developed considering charging to rechargeable batteries. "Battery charging specification revision 1.2" mainly defines ports of USB device having three types of power supplying capabilities including Standard Downstream Port (SDP), Charging Downstream Port (CDP), and Dedicated Charging Port (DCP). SDP is a port of host and hub conformed to USB 2.0. When the USB device is a low power device, the SDP has a power supply ability to generate a current of 100 mA, and when the USB device is a high power device, the SDP has a power supply ability to generate a current of 500 mA. CDP is a port of host and hub containing various power supply abilities and detection protocols conformed to USB 2.0. The CDP includes various types of ports having any one of power supplying abilities to generate the current ranging from 1.5 A to 0.5 A. DCP does not have a function as a downstream port but is a device to supply power via the port. The DCP includes various types of ports having any one of power supplying abilities to generate the current ranging from 500 mA to 5.0 A. Using a super speed port defined by USB 3.0, power of 900 mA can be supplied.

When the power is supplied from the USB host device by connecting the USB device to the USB host device (e.g., the power is supplied to charge the rechargeable battery of the USB device), the USB host device may include all of the power supplying capability. Accordingly, it is desired for the power supply of the USB device that receives the power supply to change the upper limits of the output currents of the power supply in accordance with the power supply abilities of the USB host device. However, in a configuration in which the power supply is operated in the multiple modes having different upper limit currents, performing trimming of the power supply with the conventional method is difficult.

SUMMARY

In one aspect of this disclosure, there is a trimming circuit, installed in a semiconductor integrated circuit that has multiple different target values, the trimming circuit to adjust circuit characteristics of the semiconductor integrated circuit to make output values of the semiconductor integrated circuit correspond to multiple desired target values. The trimming circuit includes a setting-value table memory, a trimming cell circuit t, and a selector. The setting-value table memory stores multiple setting value groups. Each of the setting value groups containing multiple setting values associated with the multiple target values, the setting value groups having different combinations of the multiple setting values respectively. The trimming cell circuit stores first selection information indicating one group of the multiple setting-value groups stored in the setting-value table memory. The selector receives the first selection information from the trimming cell circuit to select one group from the multiple setting-value groups stored in the setting-value table memory based on the first selection information. The selector receives external second selection information to select one setting value from the multiple setting values in the selected setting-value group based on the second selection information and causes the trimming circuit to output the selected one setting value.

In another aspect of this disclosure, there is a power supply, having multiple different desired target values, including the above-described trimming circuit to adjust circuit characteristics of the power supply to make upper limits of output currents of the power supply correspond to multiple desired target values.

In yet another aspect of this disclosure, in order to adjust circuit characteristics of the semiconductor integrated circuit to make upper limits of output currents of the semiconductor integrated circuit correspond to multiple desired target values, the trimming method, executed by a trimming circuit installed in the semiconductor integrated circuit includes the steps of: generating a judgment value table, generating a setting value table, storing the multiple setting value groups, measuring the output values of the semiconductor integrated circuit, calculating an error between the judgment values and the measured multiple output values, and storing first selection information. The judgment value table containing multiple judgment value groups that includes an initial judgment value group and the other judgment value groups is generated so that the initial judgment value group contains multiple initial judgment values equal to the multiple desired target values, the other judgment value groups contain multiple judgment values related to the multiple desired targets, and the judgment value groups contain different combinations of the multiple judgment values respectively. The setting value table containing multiple setting value groups that includes an initial setting value group and the other setting value groups is generated so that the initial setting value group contains multiple initial setting values equal to the multiple initial setting values, and the other setting value groups contain multiple other setting values that determined to compensate a difference between the other setting values and the initial setting values with a difference between the other judgment values and the initial judgment values. The multiple setting value groups are stored in a setting-value table memory. Then, initial output values of the semiconductor integrated circuit when the multiple initial setting values contained in the initial setting group are output from the trimming circuit are measured. The errors between the judgment values contained in the other judgment value group and the multiple measured initial output values are calculated. The first selection information, indicating one of the other setting-value groups that contains the multiple setting values linked with the multiple judgment values contained in one of the judgment group in which the error between the judgment values and the measured initial output values Iout are smallest, is stored.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 3 is an example of a setting value table stored in a setting-value table memory shown in FIG. 2;

FIG. 5 is one example of a judgment value table stored in a judgment-value table memory shown in FIG. 2;

FIG. 9 is one example of a setting value table contained in a setting-value table memory when offset is added based on the setting-value table, according to a second embodiment;

FIG. 10 is one example of judgment value table contained in the judgment-value table memory correlated to the judgment-value table memory table shown in FIG. 9.

DETAILED DESCRIPTION OF PREFERRED EMBODIMENTS

Figure 1:
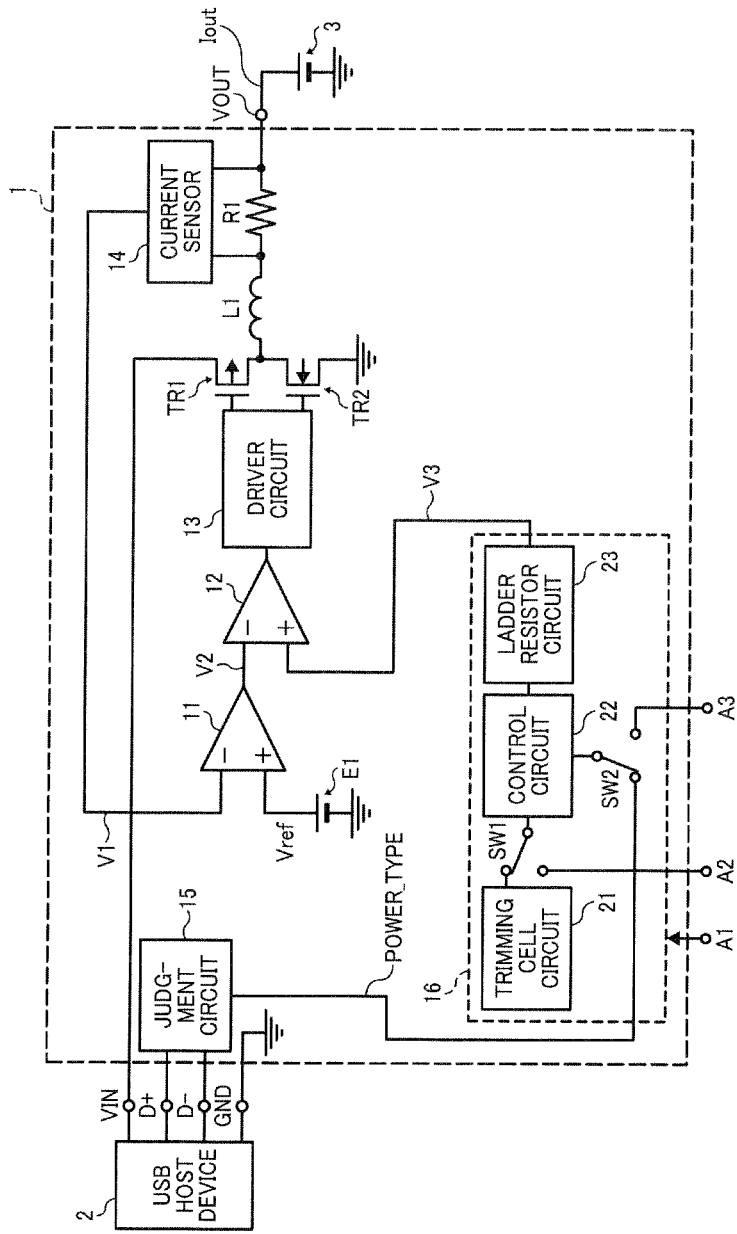
FIG. 1 is a block diagram illustrating a configuration of a power supply including a trimming circuit according to a first embodiment of the present disclosure and a USB host device connected to the power supply.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve a similar result. Referring now to the drawings, wherein like reference numerals designate identical or corresponding parts throughout the several views thereof, and particularly to FIG. 1, a trimming circuit (power supply control circuit) of the present disclosure is described.

FIG. 1 is a block diagram illustrating a configuration of a power supply 1 including a trimming circuit 16 and a USB host device 2 connected to the power supply 1.

A USB device receives power via from the USB host device 2 via a USB interface The USB device installs the power supply 1 and a load, such as, a rechargeable battery 3. The power supply 1 charge the rechargeable battery 3 of the USB device, using an output current Iout of the power supply 1. The power supply 1 may supply power to another load, instead of the rechargeable battery 3.

The power supply 1 includes an error amplifier 11, a comparator 12, a driver circuit 13, transistors TR1 and TR2, an inductor L1, a resistor R1, a current sensor 14, a judgment circuit 15, and a trimming circuit 16. The power supply 1 is a hysteric-controlled switching regulator. The error amplifier 11 amplifies error between a reference voltage Vref generated by a reference voltage source E1 and a feedback voltage V1 indicating the amount of output currents Iout detected by the current sensor 14 and outputs an error voltage V2 indicating the amplified error. The comparator 12 is a hysteresis comparator that compares the error voltage V2 with a setting voltage V3 output from the trimming circuit 16 and outputs an output signal indicating the comparison result to control the driver circuit 13. The driver circuit 13 drives the transistors TR1 and TR2 connected between an input power-supply terminal VIN of the USB interface and a ground terminal GND. A junction node between the transistors TR1 and TR2 is connected to an output voltage terminal VOUT of the power supply 1 via the inductor L1 and the resistor R1. The current sensor 14 detects the output current Iout flowing through the resistor R1 to generate the feedback voltage V1, indicating the amount of output currents tout, for outputting to the error amplifier 11. The judgment circuit 15 is connected to data terminals D+ and D− of the USB interface and determines power supplying capability of the USB host device 2 to send selection data (second selection information) POWER_TYPE indicating the judgment result of the power supplying capability.

The trimming circuit 16 of the present embodiment is installed in the semiconductor integrated circuit. The circuit characteristics in the semiconductor integrated circuit are adjusted to make output values of the semiconductor integrated circuit correspond to multiple desired target value. The semiconductor integrated circuit including the trimming circuit 16 is, for example, the power supply 1 shown in FIG. 1. At this time, the output value of the semiconductor integrated circuit is an upper limit of the output current Iout of the power supply 1. The target value (target current) is equal to the upper limit of the power supplying capacity of the USB host device 2.

Herein, the power supply 1 has multiple target currents having different values respectively, depending on the power supplying capability of the USB host device 2. Accordingly, the target currents in the power supply 1 are determined based on the selection information POWER_TYPE acquired by the judgment circuit 15. The power supply 1 controls the upper limit of the output current Iout based on the setting voltage V3 output from the trimming circuit 16 so that the upper limit of the output current Iout is consistent with the target current associated with the setting voltage V3.

Figure 2:
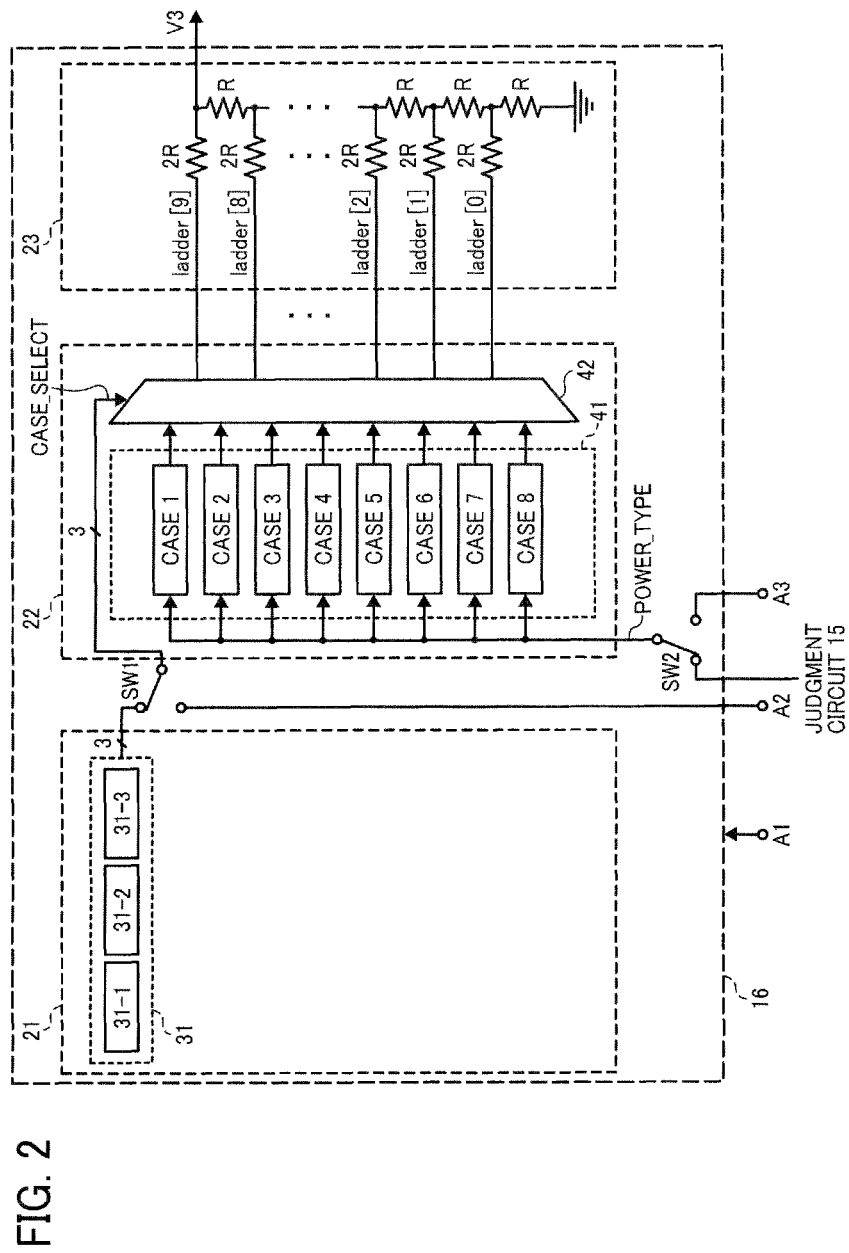
FIG. 2 is a block diagram illustrating a detail configuration of the trimming circuit shown in FIG. 1.

FIG. 2 is a block diagram illustrating a detail configuration of the trimming circuit 16 shown in FIG. 1. The trimming circuit 16 includes a trimming cell circuit 21, a control circuit 22, and a ladder resistor circuit 23. The trimming cell circuit 21 includes trimming cell group 31 containing trimming cells 31-1 through 31-3. The respective trimming cells 31-1 through 31-3 are constituted by one-time cut-able and programmable elements, for example, fuses, or one-time programmable (OTP) memories. The trimming cell group 31 stores first selection information CASE_SELECT indicating any one of the multiple setting value groups. The control circuit 22 includes a setting-value table memory 41 and a selector 42.

The setting-value table memory 41 stores a setting-value table containing multiple setting-value groups (CASE1 through CASE8 shown in FIG. 2). The multiple setting value groups contain the multiple setting values related to the multiple desired target currents, and each of the multiple setting value groups contains a different combination of the multiple setting values. Each of setting values contains information to causes the ladder resistor circuit 23 to output the certain setting voltage V3 associated with the certain target current. That is, the information for inputting to the ladder resistor circuit 23 is 10-bit signal containing ladder [0] to ladder [9]. According to the signals ladder [0] to ladder [9], high-leveled signals ladder[0] to ladder [9] are equal to a power supply voltage of the trimming circuit 16, and low-leveled signal ladder[0] to ladder [9] are equal to the ground terminal voltage of the trimming circuit 16. The ladder resistor circuit 23 is a general ladder resistor circuit that combines a resistor R having a predetermined resistance and a resistor 2R having twice of the predetermine resistance of the resistor R.

The control circuit 22 receives the first selection information CASE_SELECT from the trimming cell circuit 21 and receives the second selection information POWER_TYPE indicating any one of the multiple target currents. In the control circuit 22, the selector 42 selects one of the setting value groups "CASE1" to "CASE8", based on the first selection information CASE_SELECT, and the setting-value table memory 41 selects one value of the multiple setting values contained in the selected setting-value group based on the second selection information POWER_TYPE. Then, the control circuit 22 transmits the signals ladder [0] to ladder [9] contained in the selected setting value to the ladder resistor circuit 23 for outputting the setting voltage V3. When the different setting value is selected, the setting voltage V3 is changed, and accordingly, the upper limit of the output current Iout of the power supply 1 is changed.

FIG. 3 is one example of the setting-value table stored in the setting-value table memory 41 shown in FIG. 2. In the present embodiment, the USB host device 2 includes five stages of power supplying capability (second selection information POWER_TYPE to 5). When the POWER_TYPE is 1, a port of the USB host device 2 is a standard downstream port (SDP), and the USB host device 2 can supply a maxim current of 100 mA. When the POWER_TYPE is 2, a port of the USB host device 2 is SDP, and the USB host device 2 can supply a maxim current of 500 mA. When the POWER_TYPE is 3, a port of the USB host device 2 is a super high-speed port for USB 3.0, and the USB host device 2 can supply a maxim current of 900 mA. When the POWER_TYPE is 4, a port of the USB host device 2 is Charging Downstream Port (CDP) or dedicated charging port (DCP), and the USB host device 2 can supply a maxim current of 1500 mA. When the POWER_TYPE is 1, a port of the USB host device 2 is CDP or DCP, and the USB host device 2 can supply a maxim current of 2500 mA.

In the setting value table shown in FIG. 3, each of the setting value groups "CASE1 to CASE8" has five stages of second selection information (five setting values) POWER_TYPE=1 to 5, assigned with the five stages of the target currents (100, 500, 900, 1500, and 2500). The setting value group of "CASE1" is an initial setting value group containing five initial setting values considered when the upper limits of the output currents Iout equal to the five target currents are respectively generated. Although the respective setting values are the signals ladder [0] to ladder [9] to input to the ladder resistor circuit 23, FIG. 3 represents values, the upper limit currents [mA], considering that the upper limit currents are generated in accordance with the respective setting values.

The other setting-value groups CASE2 to CASE8 respectively contain setting values having a predetermined offset relative to the setting values contained in the setting-value group of CASE1. The respective setting values have the values linked to judgment values contained in judgment value table used for trimming process with reference to FIGS. 4 through 7, which is described detail later.

In FIG. 2, the control circuit 22 receives the first selection information CASE_SELECT from the trimming cell circuit 21 and the second selection information POWER_TYPE from the judgment circuit 15, in the normal state. However, when the power supply 1 is subjected to trimming, for example, in the initial setting, with reference to FIGS. 4 through 7, the control circuit 22 receives the first selection information input CASE_SELECT from a test circuit 4 via a terminal A2 and the second selection information POWER_TYPE input via the terminal A3. The trimming circuit 16 further includes switches SW1 and SW2 to switch the connection condition, and the switches SW1 and SW2 are operated in synchronized with a control signal input from the test circuit 4 via the terminal A1 of the test circuit 4.

Figure 4:
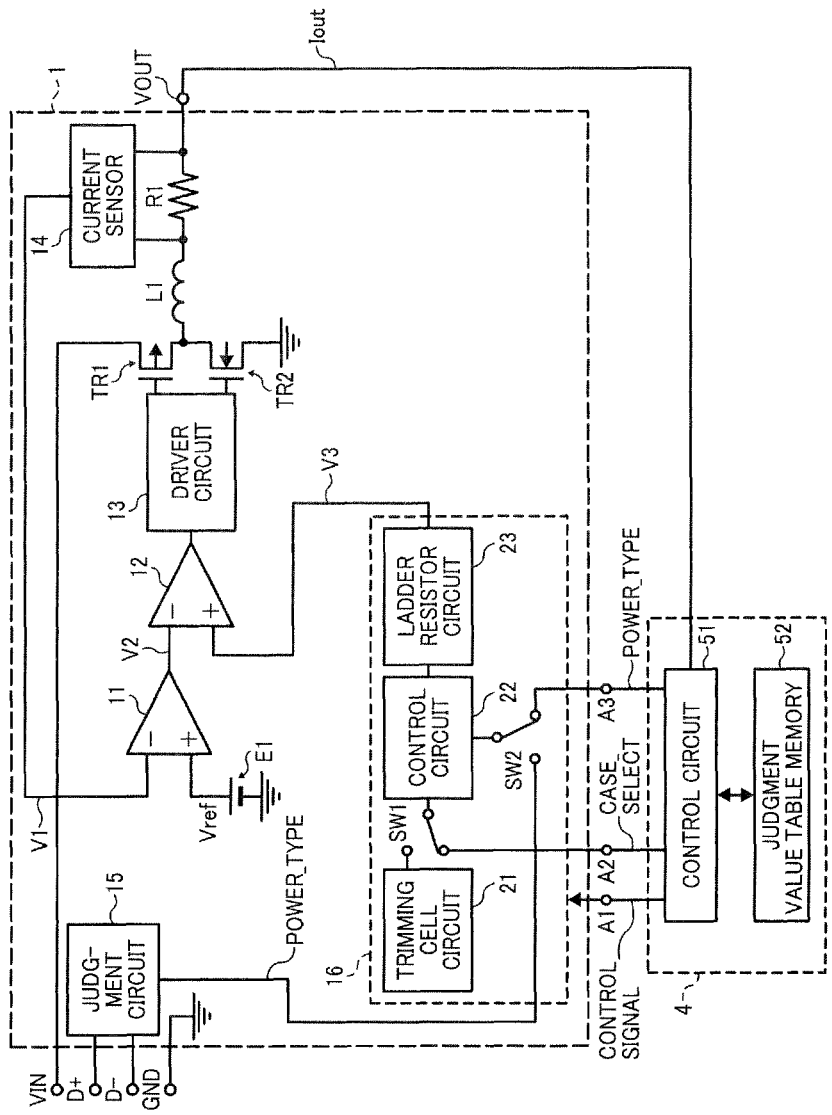
FIG. 4 is a block diagram illustrating the power supply and a test device connected to the power supply shown in FIG. 1.

FIG. 4 is a block diagram illustrating the power supply 1 and the test device 4 connected to the power supply 1. When the power supply 1 is trimmed, the power supply 1 is not connected to the USB host device 2 and the rechargeable battery 3 but connected to the test circuit 4. The test circuit 4 includes a control circuit 51 and a judgment-value table memory 52. The control circuit 51 is connected to the voltage output terminal VOUT and is connected to the trimming circuit 16 via terminals A1 through A3. The control circuit 51 has a variable load (not shown) to measure the upper limits of the output currents Iout of the power supply 1. The switches SW1 and SW2 of the trimming circuit 16 are connected so that the trimming circuit 16 can receive the selection information CASE_SELECT and POWER_TYPE from the control circuit 51 of the test circuit 4.

FIG. 5 is one example of a judgment value table stored in the judgment-value table memory 52 shown in FIG. 4. The contents of the setting-value table shown in FIG. 3 are correlated to those of the judgment-value table shown in FIG. 5 and these tables are formed when the power supply 1 is designed. The judgment-value table contains multiple judgment value groups "CASE1 to CASE8" correlated to the setting groups "CASE1 to CASE8". Each of the respective judgment-value groups has five judgment values associated with the five target currents. The multiple judgment value groups contain the five judgment values related to the multiple desired target currents, and each of the judgment value groups contains a different combination of the five judgment values. As described below, the respective judgment values are compared with the upper limits of the output currents Iout of the power supply 1.

The judgment value group of the "CASE1" is an initial judgment value group containing the multiple judgment values equal to the five target currents as initial judgment values. The other judgment value groups of CASE2 to CASE8 respectively contain the judgment values having judgment values having predetermined offsets relative to the initial judgment value contained in CASE1.

In the setting value table shown in FIG. 3, the setting value groups of the CASE1 to CASE 8 contain five setting values correlated to the five judgment values contained in the correlated respective judgment value group of CASE1 to CASE8. The five initial setting values contained in the initial setting value group of CASE1 are equal to the five initial judgment values (contained in the initial judgment value group of CASE1. In the other setting values contained in the other setting value groups CASE2 to CASE8 are determined so that differences between the other setting values and the initial setting values are compensated with a difference between the other judgment values and the initial judgment values.

For example, in the setting value group and the judgment value group of CASE2, when the target current is 100 mA (POWER_TYPE is 1), the setting value of 105 mA is determined so that the deviation of "+5" in the present setting value of 105 mA relative to the initial setting value of 100 mA compensates the deviation "−5" of the judgment value of 95 mA relative to the initial judgment value of 100 mA. The generated setting values are stored in the setting-value table memory 41 in the trimming circuit 16.

Figure 6:
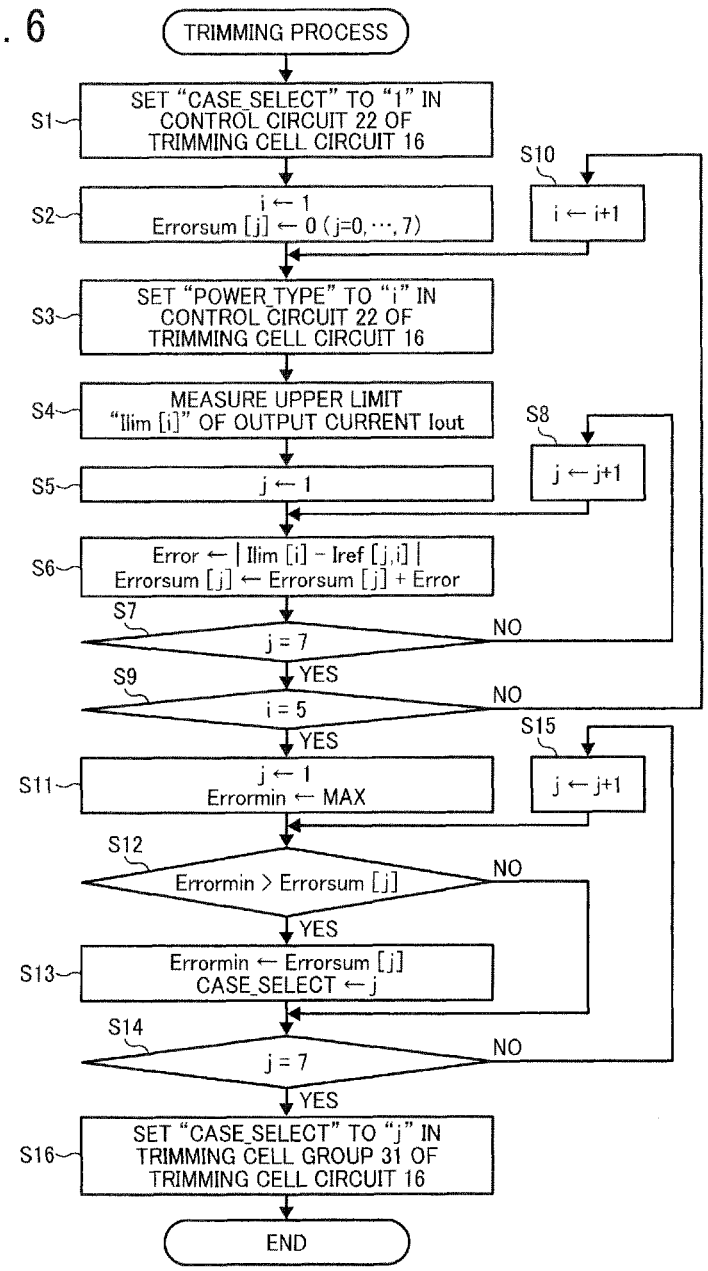
FIG. 6 is a flow chart illustrating a trimming process executed by a control circuit of a test device shown in FIG. 4.

FIG. 6 is a flow chart illustrating a trimming process executed by the control circuit 51 of the test device 4 shown in FIG. 4. In the trimming process, initially, the upper limits of the output currents Iout of the power supply 1 when the five setting values (initial setting values) contained in the setting value group of CASE1 (the upper limit currents before trimming) are respectively selected are measured.

Subsequently, for the respective judgment value groups of CASE 1 to CASE8, the errors between the five judgment values contained in the groups of CASE1 to CASE8 and the measured five upper limit currents. Then, the information indicating the setting value groups correlated to the judgment value groups whose error is the minimum is stored in the trimming cell group 31 as the first selection information CASE_SELECT.

At step S1 shown in FIG. 6, the CASE_SELECT of 1 is set in the control circuit 22 of the trimming circuit 16, and the setting value group of CASE1 is selected. At step S2, the index of the selection information POWER_TYPE is initialized to 1, and variable numbers Errorsum[j] indicating the errors between the five judgment values and the measured upper limit currents are initialized to 0. Indexes "j" (j=0, . . . 7) respectively represent the setting value groups and the judgment value groups of "CASE1 to CASE8". At step S3, the second selection information POWER_TYPE="i" is set in the control circuit 22 of the trimming circuit 16, and the second selection information POWER_TYPE="i" is selected from the setting values contained in the setting values contained in the setting value group CASE1. At step S4, the upper limit Ilim[i] of the output current Iout is measured. With this configuration, the control circuit 51 of the test device 4 measures how amount of the output current Iout is increased when the internal load connected to the output voltage terminal VOUT is changed.

At step S5, the index "j" is initialized to 1. At step S6, an absolute value of the error between the upper limit current Ilim[i] and the judgment value Iref[i, j] indicated by the indexes "i, j" substitutes into the variable number Error, and then the variable number Error is added to the variable number Errorsum [j]. At step S7, whether or not the index "j" reaches the maximum value "7" is determined. When the index "j" reaches the maximum value "7" (Yes at step S7), the process proceeds to step S9. When the index "j" does not reach the maximum value "7" (No at step S7), the index "j" increments (1 is added to the index j) at step S8, and the process proceeds to step S6.

At step S9, whether or not the index "i" reaches the maximum value "5" is determined. When the index "i" reaches the maximum value "5" (Yes at step S9), the process proceeds to step S11. When the index "i" does not reach the maximum value "5" (No at step S9), the index "i" increments (I is added to the index i) at step S10, and the process returns to step S3.

At step S11, the index "j" is initialized to "1" again, the variable number Errormin indicating the tentatively minimum error is initialized to a predetermined maximum value "MAX". At step S12, whether the error Errorsum[j] of the judgment value group is smaller or not than the minimum error at the time is determined. When the error Errorsum[j] is smaller than the minimum error, the process proceeds to step S 13. When the error Errorsum[j] is not smaller than the minimum error, the process proceeds to step S14. At step S13, the variable number Errormin indicating the minimum error is updated with the variable number Errorsum[j], and the index "i" substituted in the selection information CASE_SELECT.

At step S14, whether or not the index "j" reaches the maximum value "7" is determined. When the index "j" reaches the maximum value "7" (Yes at step S14), the process proceeds to step S16. When the index "j" does not reach the maximum value "7"(No at step S7), the index "i" increments (1 is added to the index j) at step S15, and the process returns to step S12. At step S16, the selection information CASE_SELECT "j" is set to the trimming cell group 31 of the trimming circuit 16 via the terminal A1.

Figures 7, 8:
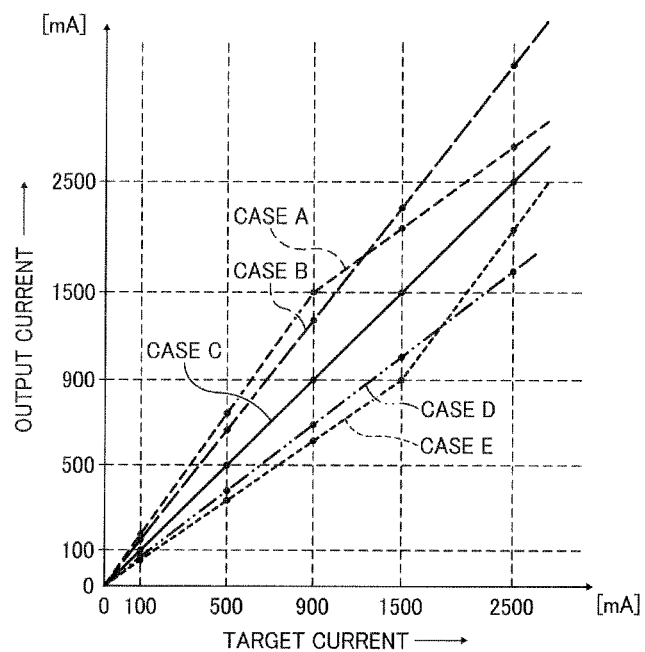
FIG. 7 is a graph illustrating upper limits of output currents relative to a target current to describe the trimming executed by the trimming circuit shown in FIG. 1.
FIG. 8 is a table showing the effect of trimming executed by the trimming circuit shown in FIG. 1.

FIG. 7 is a graph illustrating the upper limits of the output currents Iout relative to the target currents to describe the trimming executed by the trimming circuit 16 shown in FIG. 1. The target currents of a horizontal axis shown in FIG. 7 indicate the five setting values contained in the setting value group of CASE1 (Live setting values considered when the upper limits of the output currents Iout equal to the five target currents.) The output currents Iout of a vertical axis indicates the upper limit currents of the output current Iout of the power supply 1 when the respective setting values are selected.

FIG. 7 shows five examples of "CASE A through CASE E". When the power supply 1 has the circuit characteristics of CASE C, the upper limits of the output currents Iout equal to the target currents can be acquired. When the power supply 1 has the circuit characteristics of the other CASEs A, B, D, and E, the upper limits of the output currents Iout are not equal to the target current, and trimming is required. In the trimming methods of the present embodiment, the judgment value groups containing the multiple judgment values that change associated with to the upper limit currents of the output currents Iout in CASEs A, B, D, and E are generated in advance. Then, the setting value groups, correlated to the judgment groups and containing the judgment values that compensate the offsets of the judgment values relative to the target current, are generated in advance.

In the trimming circuit 16, by selecting the setting value contained in the previously generated setting value group instead of the setting value of CASE1, whenever the power supply 1 has the characteristics any of the CASEs A, B, D, and E, the upper limits of the output currents Iout can set equal to the target currents. Accordingly, with this trimming, for example, even when the upper limits of the output currents Iout does not have the linearity, that is, when the upper limit (dependent variable y) does not change at a constant rate (linearly) with the target current (independent variable x), suitable trimming process can be performed.

Herein, following formula models of the upper limits of the output currents Iout relative to the target currents represents the judgment value groups of CASE1 to CASE8 contained in the judgment value table shown in FIG. 5.

In the following description, "x" indicates the target current, the linear function "y=f(x)=a×x+b" indicates the upper limits of the output current Iout before the trimming is performed. The formulas 1 through 8 correspond to CASE1 to CASE8.

$$f(x)=1.00\times x \tag{1}$$

$$f(x)=0.95\times x \tag{2}$$

$$f(x)=1.05\times x \tag{3}$$

$$f(x)=1.05\times x \, (x \leq 900mA)$$

$$f(x)=0.90\times x+135 \, (x>900mA) \tag{4}$$

$$f(x)=1.00\times x \, (x \leq 900mA)$$

$$f(x)=0.90 x+45 \, (x>900mA) \tag{5}$$

$$f(x)=1.00\times x \, (x \leq 900mA)$$

$$f(x)=1.05\times x-45 \, (x>900mA) \tag{6}$$

$$f(x)=1.00\times x \, (x \leq 1500mA)$$

$$f(x)=1.05\times x-75 \, (x>1500mA) \tag{7}$$

$$f(x)=1.00\times x \, (x \leq 1500mA)$$

$$(x)=1.05\times x+75 \, (x>1500mA) \tag{8}$$

In the CASE4 to CASE6, the gradient of the function f(x) is changed at 900 mA. In the CASE7 and CASE8, the gradient of the function f(x) is changed at 1500 mA.

FIG. 8 is a table showing the effect of trimming executed by the trimming circuit 16 shown in FIG. 1. In the example shown in FIG. 8, the upper limit current of the output current measured when trimming is not preformed has a 1.4 times value relative to the target currents. The error is smallest in the judgment values contained in the judgment value groups of CASE3 in the judgment value table shown in FIG. 5. Accordingly, by selecting the judgment values contained in the setting value group of CASE3 shown in FIG. 3 linked with the judgment value group, the upper limits of the output currents Iout can be set closest to the target currents. The upper limit of the output currents Iout measured when the trimming is performed is 0.95 times as much as the upper limits of the output currents Iout measured when the trimming is not performed.

(Second Embodiment)

FIG. 9 is one example of setting value table contained in a setting-value table memory 41A when offset is added based on the setting value table, according to a second embodiment. FIG. 10 is one example of judgment value table contained in a judgment-value table memory 52A and correlated to the setting-value table shown in FIG. 9. When the upper limits of the output currents Iout of the power supply 1 have a constant amount of offset relative to the target currents, the offset can be compensated using the trimming method as described with reference to FIGS. 1 to 8. In the example shown in FIGS. 9 and 10, by adding the offset to the setting values in the setting-value table, the offset of the upper limit current of the output current can be compensated.

In this embodiment, the setting-value table memory 41A containing the setting-value table shown in FIG. 9 is used instead of the setting-value table memory 41 containing the setting value table shown in FIG. 3. The judgment-value table memory 52A containing the judgment value table shown in FIG. 10 is used instead of the judgment-value table memory 52 containing the judgment values shown in FIG. 5. In the judgment value table shown in FIG. 10, at least some of the multiple judgment value groups contain offset-added multiple judgment values. The multiple offset-added judgment-values are obtained by adding offsets differing in each judgment group to the multiple judgment values. More specifically, the judgment value table shown in FIG. 10 includes a (+10) offset-added judgment value group containing the offset-added judgment values obtained by adding the offset of +10 mA to the five judgment values, and a (+20) offset-added judgment value group containing the offset-added judgment values obtained by adding the offset of +20 mA to the five judgment values, in addition to the judgment value groups CASE1 and CASE2 shown in FIG. 5.

In the setting value table shown in FIG. 9, at least some of the multiple setting value groups contain the multiple offset-added setting values. The multiple offset-added setting values are obtained by adding offsets differing in each setting group to the multiple setting values. Herein, the offsets to be added to the setting values in the setting value table are decided so as to compensate the offset added to the judgment values in the judgment value table shown in FIG. 10. Accordingly, the setting value table shown in FIG. 9 includes a (−10) offset-added setting value group containing the offset-added setting values obtained by adding the offset of −10 mA to the five setting values, and a (−20) offset-added setting value group containing the offset-added setting values obtained by adding the offset of −20 mA to the five setting values, in addition to the setting value groups CASE1 and CASE2 shown in FIG. 3.

As described above, when the value "y=f(x)=a×x+b" is the upper limit of the output current Iout before trimming is performed, by performing trimming, the circuit characteristics in the power supply 1 is adjusted by trimming so that the upper limit of the output current Iout is consistent with the target current. The upper limit of the output current Iout after trimming is performed is set to the value "x=g(y)=c×y+d". Setting to compensate the value so that the gradient "a" and the offset "b" before trimming is performed as "c=1/a, d=−b/a", following formula holds.

$$g(y) = c \times f(x) + d \quad (9)$$
$$= c \times (a \times x + b) + d$$
$$= 1/a \times (a \times x + b) - b/a$$
$$= x$$

Similarly to the judgment value groups showing the judgment value table shown in FIG. 10, according to the judgment value groups of CASE3 to CASE8 shown in FIG. 5, the judgment value group table may include a (+10) offset-added judgment value group containing the offset-added judgment values obtained by adding the offset of +10 mA to the five judgment values, and a (+20) offset-added judgment value group containing the offset-added judgment values obtained by adding the offset of +20 mA to the five judgment values. Alternatively, the judgment value groups may contain the judgment values obtained by adding another offset (e.g., negative offset). Similarly to the judgment value groups, the setting value groups shown in FIG. 9 may contain additional setting value groups.

(Third Embodiment)

Figure 11:
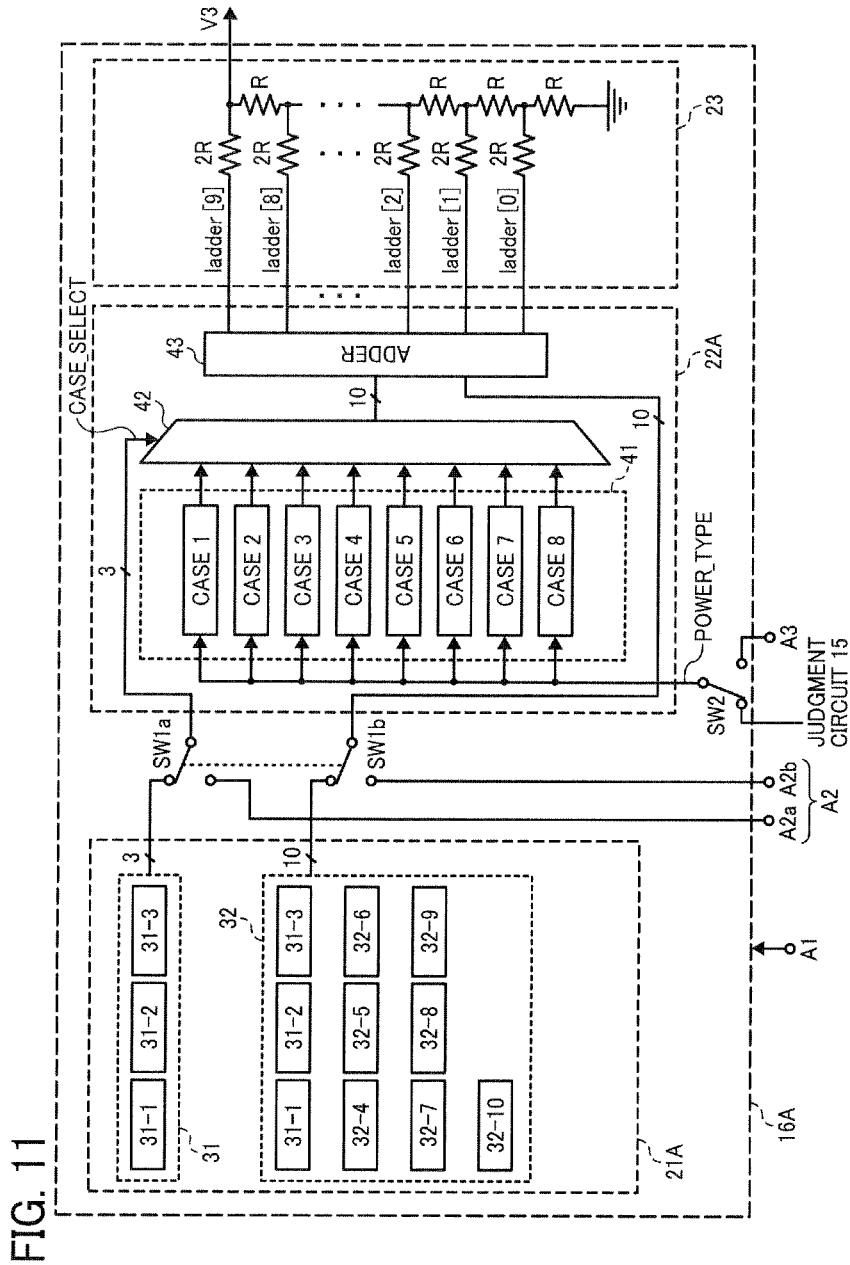
FIG. 11 is a block diagram illustrating a configuration of a trimming cell circuit when the offset is added by the trimming cell circuit according to a third embodiment.

FIG. 11 is a block diagram illustrating a configuration of a trimming cell circuit 16A when the offset is added by a trimming cell circuit 21A according to a third embodiment. The trimming circuit 16A includes the trimming cell circuit 21A, a control circuit 22A, and the ladder resistor circuit 23. The trimming cell circuit 21A includes an additional trimming cell group 32 containing second trimming cells 32-1 to 32-10, in addition to the trimming cell group 31 shown in FIG. 2. The control circuit 22A includes an adder 43 positioned subsequent to the selector 42, in addition to the setting-value table memory 41 and the selector 42 shown in FIG. 2. The second trimming cells 32-1 to 3-10 are constituted by one-time cut-able and programmable elements, for example, fuses and OTP memories similarly to the trimming cells 31-1 to 31-3. The second trimming cells 32 stores 10-bit offset, and the respective hits of the offset are added to the 10 bit signals ladder[0] to ladder[9] (setting values) by the adder 43. The control circuit 22A transmits the signal obtained by adding the offset to the selected setting value, to the ladder resistor circuit 23 as the setting voltage V3.

The control circuit 22A receives the offset when the power supply 1 is operated at the normal operation. However, when the power supply 1 is adjusted by trimming, for example, initial setting is performed, the control circuit 22A receives the offset from the test circuit 4 via the terminal A2b shown in FIG. 4. The trimming circuit 16A includes a switch SW1b to switch the conditions. The switch SW1b is activated in accordance with the control signal input from the test circuit 4 via the terminal A1. The trimming circuit 16A includes a switch SW1a equivalent to the witch SW1 shown in FIG.2. A switch SW1b is operated synchronously with the switch SW1a.

The trimming circuit 16A shown in FIG. 11, since the adder 43 adds the offset to the setting values, the setting value table can be set, considering only the adjustment of gradient of the linear function (upper limits of the output current Iout) with respect to the independent variable (the target value) and area where the value of the upper limits of the output current Iout is deviated from the values of the linear function. That is, when the upper limit of the output current Iout before trimming is performed is expressed as "y=f(x)=a×x+b", the respective setting values are determined so that the deviation (offset) of the setting value relative to the initial setting value compensates with 1/a times of the deviation of the judgment value linked to the setting value relative to the initial judgment value.

Although the configuration in which the positive offset is added to the setting value is shown in the example shown in FIG. 11; alternatively, when the certain trimming cell is "0" by adding 1 bit trimming cell representing the sign of the offset, the offset may be added, and when the certain trimming cell is "1", the offset may be subtracted.

In addition, the numbers of the setting value groups and judgment value groups are not limited to 8. The signal input to the ladder resistor circuit 23 is not limited to 10 bit.

In the above-described embodiment, a simple equation is used to generate the judgment value table and the setting value table, the judgment value table and the setting value table may be generated by another method. For example, by anticipating the fluctuation range using post simulation, the setting value table correlated to the judgment value table can be generated.

As described above, in the trimming circuit 16, installed in the semiconductor integrated circuit 1 that has multiple different target values, in order to adjust circuit characteristics of the semiconductor integrated circuit 1 to make output values of the semiconductor integrated circuit correspond to multiple desired target values (100, 500, 900, 1500, and 2500), the trimming circuit 16 includes a setting-value table memory 41, a trimming cell circuit 21, and a selector 42. The setting-value table memory 41 stores multiple setting value groups "CASE1 to CASE8". Each of the setting value groups "CASE1 to CASE8" containing multiple setting values associated with the multiple target values, and the setting value groups have different combinations of the multiple setting values respectively. The trimming cell circuit 21 stores first selection information CASE_SELECT indicating one group of the multiple setting value groups "e.g., CASE3 (see FIG. 5)" stored in the setting-value table memory 41. The selector 42 receives the first selection information CASE_SELECT from the trimming cell circuit 21 to select one group CASE3 from the multiple setting-value groups stored in the setting-value table memory 41 based on the first selection information CASE_SELECT. The selector 42 receives external second selection information POWER_TYPE to select one setting value from the multiple setting values in the selected setting-value group CASE3 based on the second selection information POWER_TYPE and causes the trimming circuit 16 (ladder resistor circuit 23) to output the selected one setting value.

In the second embodiment, the trimming circuit 16, at least some of the multiple judgment value groups contain offset-added multiple judgment value obtained by adding offsets differing in each judgment group to the multiple judgment values.

In the third embodiment, the trimming cell circuit 21A contains certain offsets, and the adder 43 adds the certain offset to the selected setting value to cause the trimming circuit 16 to output the offset-added setting value.

In addition, the trimming cell circuit 21 includes multiple fuses or multiple one time programmable memories.

In the conventional trimming circuit including only an adder or multiplexer, the offset and the gradient can be corrected by performing trimming, a semiconductor integrated circuit in which the output value (the circuit characteristics) does not linearly change in relation to the target value cannot be corrected. By contrast, in the present disclosure, the trimming circuit can perform trimming using the setting value table, the correction can be performed for the circuit in which the output value (the circuit characteristics) does not linearly change in relation to the target value with a high degree of accuracy.

Furthermore, in the trimming circuit 16(16A) installed in the semiconductor integrated circuit of the present disclosure, even when the output values of the semiconductor integrated circuit changes over a wide range, accurate trimming can be performed.

In the second embodiment, the offset can be corrected using the setting-value table 41. Alternatively, in the third embodiment, the offset can be corrected using the adder 41, instead of the setting value group. Accordingly, increasing the setting value group is unnecessary, which facilitates designing the circuit.

In the above-described embodiments, since the trimming cells are constituted by fuses and OTP memories, the output value of the semiconductor integrated circuit after trimming is performed can be set as a permanent value. As described above, the power supply 1, having multiple different desired target values, includes the trimming circuit 16 to adjust circuit characteristics of the power supply 1 to make upper limits of output currents of the power supply 1 correspond to the target values. The trimming circuit 16 includes the setting-value table memory 41 to store multiple setting value groups, each of the setting value groups 41 containing multiple setting values associated with the multiple target values, the setting value groups having different combinations of the multiple setting values respectively; the trimming cell circuit 21 to store first selection information indicating one group "e.g., CASE3" of the multiple setting-value groups stored in the setting-value table memory 41. The selector 42 receives the first selection information CASE_SELECT from the trimming cell circuit 21 to select one group CASE3 from the multiple setting-value groups stored in the setting-value table memory 41 based on the first selection information CASE_SELECT, and receive external second selection information POWER_TYPE to select one setting value from the multiple setting values in the selected setting-value group CASE3 based on the second selection information. The selector 42 causes the trimming circuit 16 (ladder resistor circuit 23) to output the selected one setting valueV3 used for generating one of the upper limits of output currents Iout of the power supply 1.

In addition, the power supply 1 is installed in the USB device that receives power from a USB host device via a USB interface and the multiple target values are upper limits of power supplying capacities of the USB device. The USB device includes a rechargeable battery and the power supply charges the rechargeable battery using the output current of the power supply.

According to the power supply, following priority point can be present. In the general switching regulator, as the load current is increased, the influence of generating the noises and heating is increased. Therefore, in the switching regulator that operates under constant current control, when a small output current is set, the output currents are identical to the desired values. However, when a large current is set, the output current becomes lower than the desired value. Similarly to the upper limit currents, when the small upper limit current is set, the output current is limited at the desired value; when the large upper limit current is set, the output current is limited at a value lower than the desired value.

By contrast, in the power supply of the present embodiment, trimming can be performed even for the circuit in which the output value does not linearly change in relation to the target value. Therefore, the switching regulator having the accuracy as designed can be achieved even when the large current is set.

In addition, the power supply 1 of the present disclosure can switch the output currents depending on the power supplying capability of the USB host device. Therefore, the switching regulator and a charge control circuit and conformed to standards of "Battery charging specification revision 1.2" can be designed. Herein, the power supply 1 is constituted by a switching regulator, a series regulator, and a power management integrated circuit, etc.

Herein, the semiconductor integrated circuit including the trimming circuit 16(16A) is not limited to the power supply 1 in the above-described embodiments, and the semiconductor integrated circuit including the trimming circuit 16(16A) may be a charge control circuit. In this case, a charge control circuit is installed in a universal serial bus (USB) device that receives power from a USB host device via a USB interface, the trimming circuit 16 adjusts circuit characteristics of the charge control circuit to make charging currents of the charge control circuit correspond to the multiple target values, and the multiple target values represent upper limits of power supplying capacities of the USB device.

As described above, in order to adjust circuit characteristics of the semiconductor integrated circuit 1 to make upper limits of output currents Iout of the semiconductor integrated circuit 1 correspond to multiple desired target values (100, 500, 900, 1500, 2500), the trimming method, executed by the trimming circuit 16 installed in the semiconductor integrated circuit 1 includes the steps of: generating a judgment value table, generating a setting value table, storing the multiple setting value groups, measuring the output values of the semiconductor integrated circuit 1, calculating an error between the judgment values and the measured multiple output values, and storing first selection information.

More specifically, the judgment value table (shown in FIG. 5), containing multiple judgment value groups "CASE1 to CASE8" that includes an initial judgment value group "CASE1" and the other judgment value groups "CASE2 through CASE8", is generated so that the initial judgment value group CASE1 contains multiple initial judgment values (100, 500, 900, 1500, 2500) equal to the multiple desired target values (100, 500, 900, 1500, 2500), the other judgment value groups CASE2 through CASE8 contain multiple judgment values related to the multiple desired targets (100, 500, 900, 1500, 2500), and the judgment value groups CASE2 through CASE8 contain different combinations of the multiple judgment values respectively.

Then, the setting value table (shown in FIG. 3), containing multiple setting value groups CASE1 through CASE8 that includes an initial setting value group CASE 1 and the other setting value groups CASE2 through CASE8, is generated so that the initial setting value group CASE1 contains multiple initial setting values equal to the multiple initial setting values (100, 500, 900, 1500, 2500), and the other setting value groups CASE2 through CASE8 contain multiple other setting values that determined to compensate differences between the other setting values and the initial setting values with differences between the other judgment values and the initial judgment values. The multiple setting value groups are stored in the setting-value table memory 41.

Subsequently, initial output values of the semiconductor integrated circuit 1 when the multiple initial setting values contained in the initial setting group CASE1 are output from the trimming circuit 16 are measured. The errors between the judgment values contained in the other judgment value group and the multiple measured initial output values are calculated. Then, the first selection information CASE_SELECT, indicating one of the other setting-value groups "e.g., CASE3" that contains the multiple setting values linked with the multiple judgment values contained in one of the judgment group CASE3 in which the error between the judgment values and the measured initial output values Iout are smallest, is stored.

In the trimming method according to the present disclosure, the setting value group in which the errors between the upper limit of the output current Iout and the target value are smallest can be selected, and therefore, appropriate trimming can be performed.

The trimming circuit 16(16A) of the present disclosure is used for various types of power supply, such as, switching regulator, a series regulator, a power management IC, and a charge control circuit IC. In addition, the trimming circuit 16(16A) of the present disclosure can be used for various types of other semiconductor integrated circuit, such as, a circuit (circuit system) having a fuse and/or a one time programmable (OTP) memory.

Numerous additional modifications and variations are possible in light of the above teachings. It is therefore to be understood that, within the scope of the appended claims, the disclosure of this patent specification may be practiced otherwise than as specifically described herein.

What is claimed is:

1. A trimming circuit, installed in a semiconductor integrated circuit that has multiple different target values, the trimming circuit to adjust circuit characteristics of the semiconductor integrated circuit to make output values of the semiconductor integrated circuit correspond to multiple desired target values,
the trimming circuit comprising:
a setting-value table memory to store multiple setting value groups, each of the setting value groups containing multiple setting values associated with the multiple target values, the setting value groups having different combinations of the multiple setting values respectively;
a trimming cell circuit to store first selection information indicating one group of the multiple setting-value groups stored in the setting-value table memory; and
a selector configured to
receive the first selection information from the trimming cell circuit to select one group from the multiple setting-value groups stored in the setting-value table memory based on the first selection information, and
receive external second selection information to select one setting value from the multiple setting values in the selected setting-value group based on the second selection information and causes the trimming circuit to output the selected one setting value.

2. The trimming circuit according to claim 1, wherein at least some of the multiple setting value groups contain offset-added multiple setting values obtained by adding offsets differing in each setting group to the multiple setting values.

3. The trimming circuit according to claim 1, wherein the trimming cell circuit further contains offsets, and
wherein the trimming circuit comprises an adder to add a certain offset to the selected setting value to cause the trimming circuit to output the offset added setting value.

4. The trimming circuit according to claim 1, wherein the trimming cell circuit comprises multiple fuses or multiple one time programmable memories.

5. A power supply, having multiple different desired target values, comprising:
a trimming circuit to adjust circuit characteristics of the power supply to make upper limits of output currents of the power supply correspond to the target values,
the trimming circuit comprising:
a setting-value table memory to store multiple setting value groups, each of the respective setting value groups containing multiple setting values associated with the multiple target values, the setting value groups having different combinations of the multiple setting values respectively;
a trimming cell circuit to store first selection information indicating one group of the multiple setting-value groups stored in the setting-value table memory; and
a selector configured to
receive the first selection information from the trimming cell circuit to select one group from the multiple setting-value groups stored in the setting-value table memory based on the first selection information,
receive external second selection information to select one setting value from the multiple setting values in the selected setting-value group based on the second selection information, and
cause the trimming circuit to output the selected one setting value used for generating one of the upper limits of output currents of the power supply.

6. The power supply according to claim 5, wherein the power supply is installed in a universal serial bus (USB) device that receives power from a USB host device via a USB interface,
wherein the multiple target values represent upper limits of power supplying capacities of the USB device.

7. The power supply according to claim 6, wherein the USB device comprises a rechargeable battery and the power supply charges the rechargeable battery using the output current of the power supply.

8. A trimming method, executed by a trimming circuit installed in a semiconductor integrated circuit, to adjust circuit characteristics of the semiconductor integrated circuit to make output values of the semiconductor integrated circuit correspond to multiple desired target values,
the method comprising the steps of:
generating a judgment value table containing multiple judgment value groups that includes an initial judgment value group and the other judgment value groups, the initial judgment value group containing multiple initial judgment values equal to the multiple desired target values, the other judgment value groups containing multiple judgment values related to the multiple desired targets, and the judgment value groups containing different combinations of the multiple judgment values respectively;

generating a setting value table containing multiple setting value groups that includes an initial setting value group and the other setting value groups, the initial setting value group containing multiple initial setting values equal to the multiple initial setting values, and the other setting value groups containing multiple other setting values that determined to compensate a difference between the other setting values and the initial setting values with a difference between the other judgment values and the initial judgment values;

storing the multiple setting value groups in a setting-value table memory;

measuring multiple initial output values of the semiconductor integrated circuit when the multiple initial setting values contained in the initial setting group are output from the trimming circuit;

calculating errors between the judgment values contained in the other judgment value group and the measured multiple initial output values; and storing first selection information indicating one of the other setting-value groups that contains the multiple setting values linked with the multiple judgment values contained in one of the other judgment group in which the error between the judgment values and the measured initial output values is smallest.

* * * * *